US012646563B2

(12) United States Patent
Lin

(10) Patent No.: US 12,646,563 B2
(45) Date of Patent: Jun. 2, 2026

(54) MEMORY DEVICE AND OPERATION METHOD OF THE SAME

(71) Applicant: MACRONIX INTERNATIONAL CO., LTD., Hsinchu (TW)

(72) Inventor: Yu-Yu Lin, New Taipei City (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 154 days.

(21) Appl. No.: 18/830,694

(22) Filed: Sep. 11, 2024

(65) Prior Publication Data

US 2026/0073983 A1    Mar. 12, 2026

(51) Int. Cl.
*G11C 13/00* (2006.01)
*G11C 11/54* (2006.01)

(52) U.S. Cl.
CPC ............ *G11C 13/004* (2013.01); *G11C 11/54* (2013.01); *G11C 13/0069* (2013.01)

(58) Field of Classification Search
CPC .... G11C 13/004; G11C 11/54; G11C 13/0069
USPC ........................................................ 365/148
See application file for complete search history.

(56) References Cited

U.S. PATENT DOCUMENTS

| | | | | |
|---|---|---|---|---|
| 11,749,372 B2 * | 9/2023 | Yang | .................. | G11C 11/1655 |
| | | | | 365/158 |
| 2003/0147270 A1 | 8/2003 | Baker | | |
| 2012/0236624 A1 | 9/2012 | Costa | | |
| 2024/0021244 A1 * | 1/2024 | Lin | ........................ | G06N 3/065 |

OTHER PUBLICATIONS

Z. Liu et al., "Nonuniform-to-Uniform Quantization: Towards Accurate Quantization via Generalized Straight-Through Estimation," arXiv:2111.14826v2 [cs.CV], Apr. 7, 2022.
C. Baskin et al., "UNIQ: Uniform Noise Injection for Non-Uniform Quantization of Neural Networks," arXiv: 1804.10969v3 [cs.LG] Oct. 2, 2018.
Y. Li et al., "Additive Powers-Of-Two Quantization: an Efficient Non-Uniform Discretization for Neural Networks," arXiv:1909. 13144v2 [cs.LG] Feb. 2, 2020.

* cited by examiner

*Primary Examiner* — Huan Hoang
(74) *Attorney, Agent, or Firm* — McClure, Qualey & Rodack, LLP

(57) ABSTRACT

A memory device comprising a memory array, a sensing circuit and a control circuit is provided. The memory array comprises a plurality of memory cells respectively having a first resistance or a second resistance greater than the first resistance. When all memory cells have the first resistance, an equivalent resistance of the memory array is equal to a first equivalent resistance. When all memory cells have the second resistance, the equivalent resistance of the memory array is equal to a second equivalent resistance greater than the first equivalent resistance. The sensing circuit is coupled to the memory array and is configured to sense the equivalent resistance. The control circuit is coupled to the memory array and is configured to adjust the second resistance, so as to make the second equivalent resistance be within a specified magnification range of one of a plurality of sensing levels of the sensing circuit.

16 Claims, 5 Drawing Sheets

100

MEMORY DEVICE AND OPERATION METHOD OF THE SAME

BACKGROUND

Technical Field

The present disclosure relates to the configuration of resistances of a memory array. More particularly, the present disclosure relates to a memory device with an increased equivalent resistance and an operation method of the same.

Description of Related Art

With the development of computer technology and artificial intelligence, the amount of data involved in computing is becoming larger and larger. Therefore, memory structures using in-memory-computing (IMC) have been proposed to enhance the computing speed of memory devices.

However, since the weight values of memory cells tend to concentrate in a specific range, the range of equivalent resistances of the memory array may not include the sensing levels of the sensing circuit, resulting in the memory device being unable to output accurate calculation results. Therefore, how to alleviate the impact of the above situation on memory devices is one of the topics in this field.

SUMMARY

A memory device is provided in the present disclosure. The memory device comprises a memory array, a sensing circuit and a control circuit. The memory array comprises a plurality of memory cells. Each of the plurality of memory cells has a first resistance or a second resistance greater than the first resistance. When all of the plurality of memory cells have the first resistance, an equivalent resistance of the memory array is equal to a first equivalent resistance. When all of the plurality of memory cells have the second resistance, the equivalent resistance of the memory array is equal to a second equivalent resistance greater than the first equivalent resistance. The sensing circuit is coupled to the memory array and is configured to sense the equivalent resistance. The control circuit is coupled to the memory array and is configured to adjust the second resistance, so as to make the second equivalent resistance be within a specified magnification range of one of a plurality of sensing levels of the sensing circuit.

In some embodiments of the memory device, the plurality of memory cells are configured to store a plurality of weight values of a neural network based on the first resistance and the second resistance.

In some embodiments of the memory device, the sensing circuit is further configured to generate a computing value according to the plurality of sensing levels and the equivalent resistance. The computing value is positively related to the plurality of sensing levels and positively related to the equivalent resistance.

In some embodiments of the memory device, the memory array comprises M memory strings, and each of the M memory strings comprises N of the plurality of memory cells, wherein M and N are positive integers. A resolution of the memory device is positively related to M.

In some embodiments of the memory device, the number of the plurality of sensing levels is positively related to the resolution of the memory device.

In some embodiments of the memory device, each of the M memory strings further comprises an auxiliary resistor, and the N of the plurality of memory cells and the auxiliary resistor are coupled is series.

In some embodiments of the memory device, the first equivalent resistance is equal to the first resistance multiplied by N, plus a resistance of the auxiliary resistor and then divided by M, and the second equivalent resistance is equal to the second resistance multiplied by N, plus the resistance of the auxiliary resistor and then divided by M.

In some embodiments of the memory device, the control circuit is further coupled to the sensing circuit, and the control circuit is further configured to adjust the plurality of sensing levels.

An operation method suitable for a memory device is provided in the present disclosure. A memory array of the memory device comprises a plurality of memory cells. The operation method comprises: setting, by a control circuit of the memory device, the plurality of memory cells to have a first resistance or a second resistance, wherein when all of the plurality of memory cells have the first resistance, an equivalent resistance of the memory array is equal to a first equivalent resistance, when all of the plurality of memory cells have the second resistance, the equivalent resistance of the memory array is equal to a second equivalent resistance greater than the first equivalent resistance; adjusting, by the control circuit, the second resistance, so as to make the second equivalent resistance be within a specified magnification range of one of a plurality of sensing levels of a sensing circuit of the memory device; and sensing, by the sensing circuit, the equivalent resistance.

In some embodiments of the operation method, the operation method further comprises: storing, by the plurality of memory cells, a plurality of weight values of a neural network, based on the first resistance and the second resistance.

In some embodiments of the operation method, the operation method further comprises: generating, by the sensing circuit, a computing value according to the plurality of sensing levels and the equivalent resistance, wherein the computing value is positively related to the plurality of sensing levels and positively related to the equivalent resistance.

In some embodiments of the operation method, the memory array comprises M memory strings, and each of the M memory strings comprises N of the plurality of memory cells, wherein M and N are positive integers. A resolution of the memory device is positively related to M.

In some embodiments of the operation method, the number of the plurality of sensing levels is positively related to the resolution of the memory device.

In some embodiments of the operation method, each of the M memory strings further comprises an auxiliary resistor, and the N of the plurality of memory cells and the auxiliary resistor are coupled is series.

In some embodiments of the operation method, the first equivalent resistance is equal to the first resistance multiplied by N, plus a resistance of the auxiliary resistor and then divided by M, and the second equivalent resistance is equal to the second resistance multiplied by N, plus the resistance of the auxiliary resistor and then divided by M.

In some embodiments of the operation method, the operation method further comprises: adjusting, by the control circuit, the plurality of sensing levels.

With the memory device and the operation method of the same in the present disclosure, the problem of inaccurate output results of memory devices due to the difference between the calculated equivalent resistance and the actual equivalent resistance can be alleviated.

It is to be understood that both the foregoing general description and the following detailed description are by examples, and are intended to provide further explanation of the disclosure as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

Reference will now be made in detail to the present embodiments of the disclosure, examples of which are illustrated in the accompanying drawings.

In the present disclosure, when an element is referred to as "connected", it may mean "electrically connected" or "optical connected". When an element is referred to as "coupled", it may mean "electrically coupled" or "optical coupled". "Connected" or "coupled" can also be used to indicate that two or more components operate or interact with each other. As used in the present disclosure, the singular forms "a", "one" and "the" are also intended to include plural forms, unless the context clearly indicates otherwise. It will be further understood that when used in this specification, the terms "comprises (comprising)" and/or "includes (including)" designate the existence of stated features, steps, operations, elements and/or components, but the existence or addition of one or more other features, steps, operations, elements, components, and/or groups thereof are not excluded.

Figure 1:
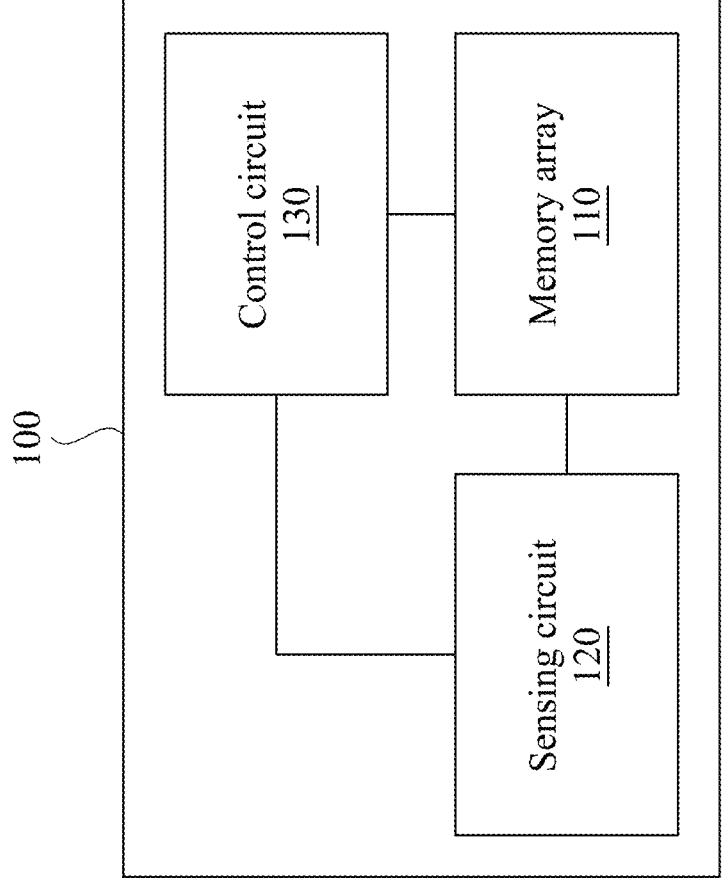
FIG. 1 is a functional block diagram of a memory device in accordance with some embodiments of the present disclosure.

FIG. 1 is a functional block diagram of a memory device 100 in accordance with some embodiments of the present disclosure. In some embodiments, the memory device 100 comprises a memory array 110, a sensing circuit 120 and a control circuit 130.

The memory array 110 is coupled to the sensing circuit 120 and the control circuit 130, and is configured to store a plurality of data (e.g., a plurality of weight values of a neural network) to perform in-memory-computing (IMC). The memory array 110 has an equivalent resistance varying according to changes in the resistances of the plurality of memory cells in the memory array 110. The structure of the memory array 110 and the calculation of the equivalent resistance will be described in detail in subsequent paragraphs.

The sensing circuit 120 is coupled to the memory array 110, and is configured to sense the equivalent resistance of the memory array 110 and generate corresponding computing values according to a plurality of sensing levels and sensed equivalent resistance. In some embodiments, the equivalent resistance can be determined according to the measured current, resistances of the plurality of memory cells, delay time, other electrical characteristics, or any combination of the above.

The control circuit 130 is coupled to the memory array 110, and is configured to set the resistances of the plurality of memory cells in the memory array 110, so as to make the memory array 110 have various equivalent resistances. In some embodiments, the control circuit 130 is further coupled to the sensing circuit 120 (as shown in FIG. 1), and is configured to adjust the plurality of sensing levels of the sensing circuit 120.

Figure 2:
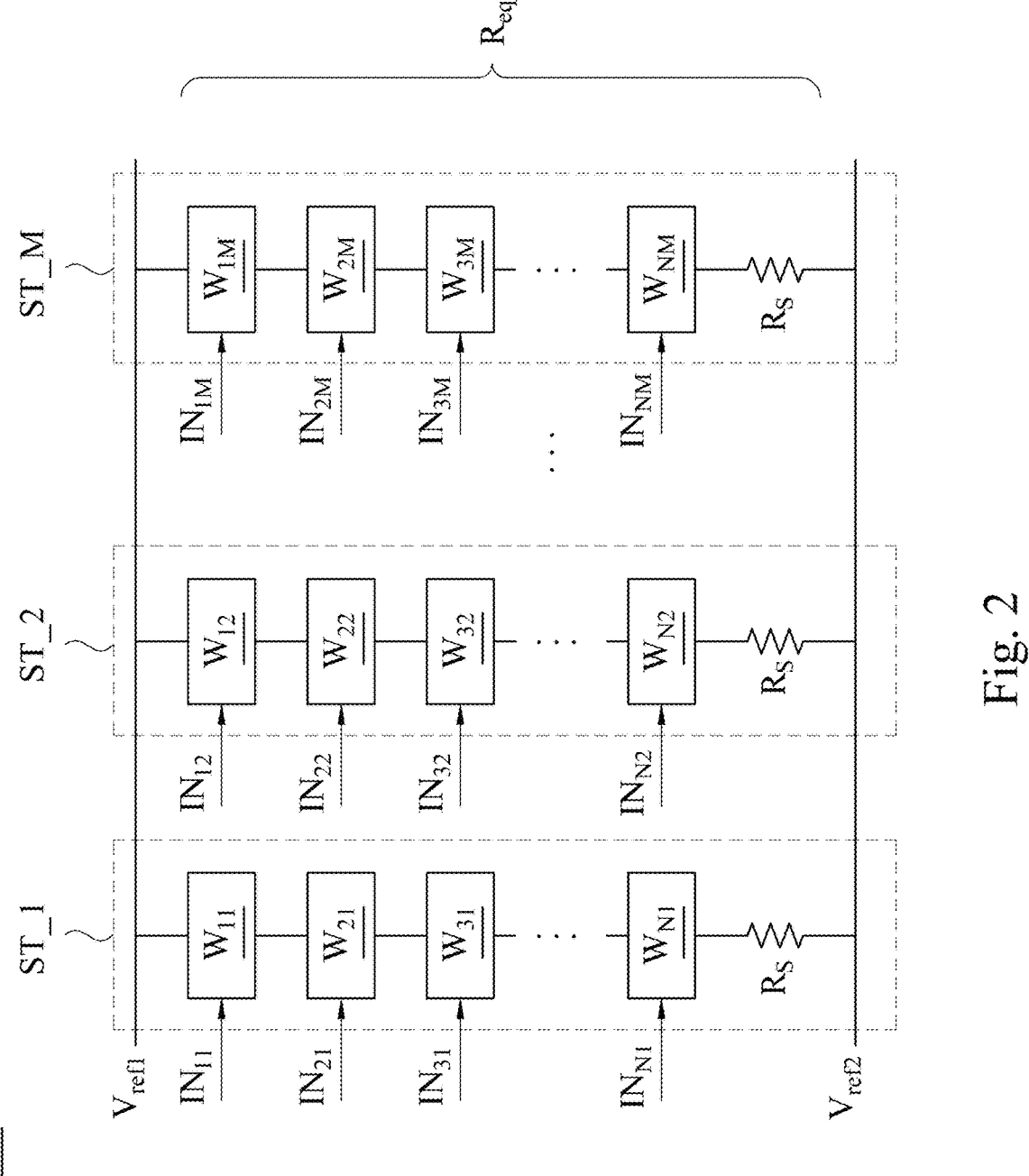
FIG. 2 is a schematic diagram of a memory array in accordance with some embodiments of the present disclosure.

FIG. 2 is a schematic diagram of the memory array 110 in accordance with some embodiments of the present disclosure. In some embodiments, the memory array 110 comprises memory strings ST_1-ST_M, and each of the memory strings comprises N memory cells coupled in series between reference voltages $V_{ref1}$ and $V_{ref2}$, thereby forming an array with M*N memory cells, wherein M and N are positive integers. In some embodiments, each of the memory cells is configured to receive an input signal to store a data (e.g., a weight value of a neural network). Take the embodiment of FIG. 2 as an example, the memory string ST_1 comprises memory cells coupled in series, and these memory cells are configured to respectively receive input signals $IN_{11}$, $IN_{21}$, $IN_{31}$, . . . , and $IN_{N1}$, so as to respectively store weight values $W_{11}$, $W_{21}$, $W_{31}$, . . . , and $W_{N1}$. The memory string ST_2 comprises memory cells coupled in series, and these memory cells are configured to respectively receive input signals $IN_{12}$, $IN_{22}$, $IN_{32}$, . . . , and $IN_{N2}$, so as to respectively store weight values $W_{12}$, $W_{22}$, $W_{32}$, . . . , and $W_{N2}$. The memory string ST_M comprises memory cells coupled in series, and these memory cells are configured to respectively receive input signals $IN_{1M}$, $IN_{2M}$, $IN_{3M}$, . . . , and $IN_{NM}$, so as to respectively store weight values $W_{1M}$, $W_{2M}$, $W_{3M}$, . . . , and $W_{NM}$.

In some embodiments, each of the memory strings ST_1-ST_M further comprises an auxiliary resistor $R_S$, and this auxiliary resistor $R_S$ is coupled in series with the plurality of memory cells in the memory string where it is located. Therefore, the equivalent resistance $R_{eq}$ of the memory array 110 can be calculated based on the resistances of each memory cell and the auxiliary resistor $R_S$.

Specifically, each memory cell may have a resistance $R_L$ (e.g., corresponding to a bit value 0) or a resistance $R_H$ (e.g., corresponding to a bit value 1) according to the weight value stored in the memory cell, wherein the resistance $R_H$ is greater than the resistance $R_L$. Therefore, the equivalent resistance $R_{eq}$ of the memory array 110 can be described with the following Formula 1:

$$R_{eq} = \frac{R_S + NR_L}{M} + \frac{R_H - R_L}{M} N_\mu. \qquad \text{Formula 1}$$

Wherein $N_\mu$ represents the average number of memory cells with resistance $R_H$ in each memory string of the memory array 110.

Figure 3:
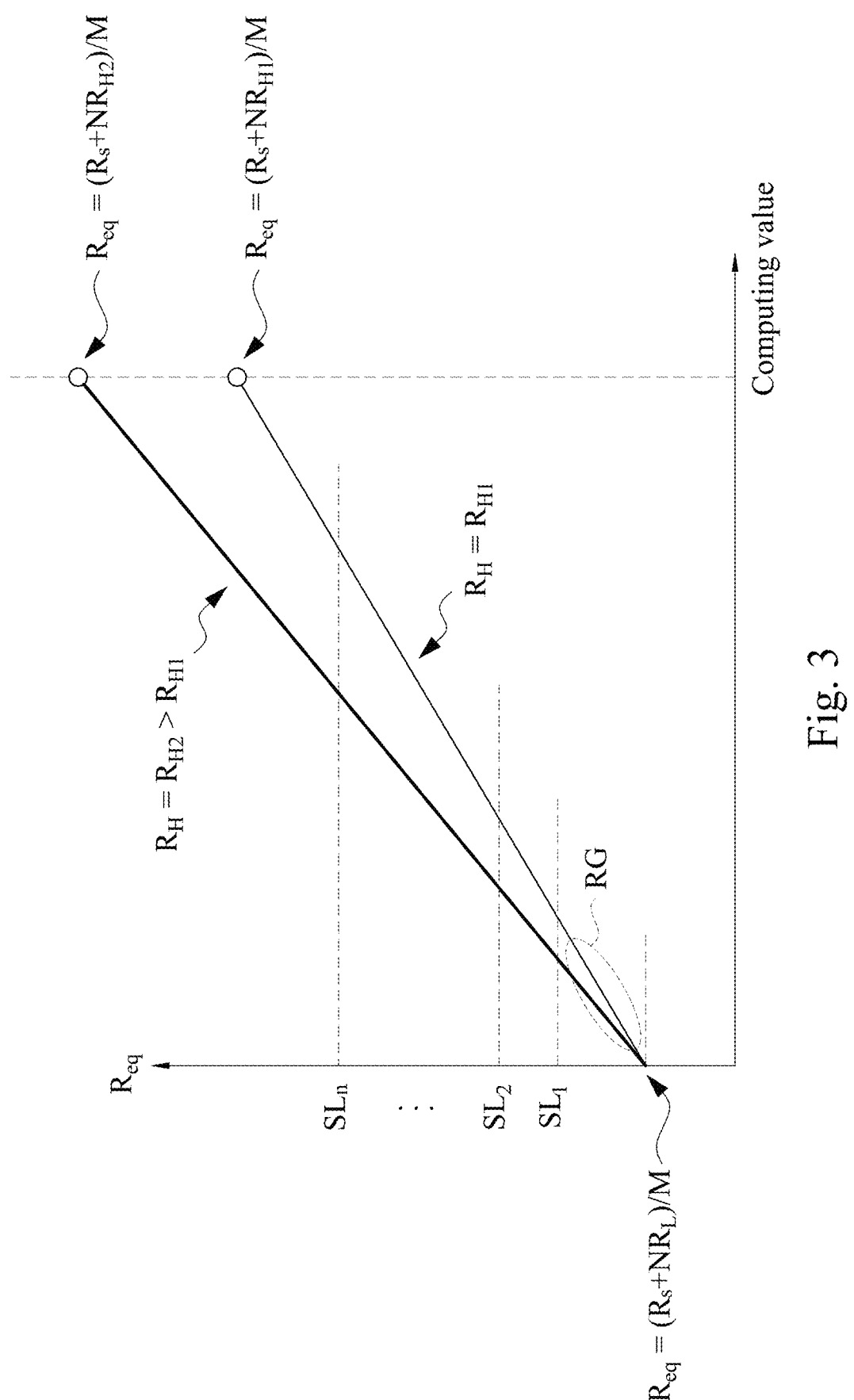
FIG. 3 is a schematic diagram of the relationship between resistance, equivalent resistance and computing value in accordance with some instances.

FIG. 3 is a schematic diagram of the relationship between the resistance $R_H$, the equivalent resistance $R_{eq}$ and computing values in accordance with some instances. The two straight lines shown in FIG. 3 respectively represent the relationship between the equivalent resistance $R_{eq}$ and the computing value under the conditions of different resistances $R_H$.

In some embodiments, the computing value generated by the sensing circuit 120 is positively related to the equivalent resistance $R_{eq}$ of the memory array 110. Therefore, for the two straight lines in FIG. 3, the leftmost points of the straight lines represent the equivalent resistance $R_{eq}$ when the resistances of all memory cells in the memory array are set to the resistance $R_L$ (i.e., the average number $N_\mu$ is 0 and the equivalent resistance $R_{eq}$ has a minimum value).

$$R_{eq} = \frac{R_S + NR_L}{M}. \qquad \text{Formula 2}$$

On the other hand, the rightmost points of the straight line represent the equivalent resistance $R_{eq}$ when the resistances of all memory cells in the memory array are set to the resistance $R_H$ (i.e., the average number $N_\mu$ is N and the equivalent resistance $R_{eq}$ has a maximum value).

$$R_{eq} = \frac{R_S + NR_L}{M} + \frac{R_H - R_L}{M}N = \frac{1}{M}(R_S + NR_H). \qquad \text{Formula 3}$$

It can be known form Formula 3 that under the condition that the resistance of the auxiliary resistor $R_S$ is fixed, when the resistance $R_H$ is greater, the equivalent resistance $R_{eq}$ will also be greater. Therefore, as shown in FIG. 3, the slope of the straight line of the equivalent resistance $R_{eq}$ corresponding to the greater resistance $R_{H2}$ will be greater than the slope of the straight line of the equivalent resistance $R_{eq}$ corresponding to the lower resistance $R_{H1}$.

In some embodiments, the sensing circuit 120 is configured with sensing levels $SL_1$, $SL_2$, . . . , and $SL_n$, wherein n is an integer. In some embodiments, the computing value generated by the sensing circuit 120 is positively related to the sensing levels $SL_1$, $SL_2$, . . . , and $SL_n$. The sensing circuit 120 is configured to compare the measured equivalent resistance $R_{eq}$ with the sensing levels $SL_1$, $SL_2$, . . . , and $SL_n$, so as to generate corresponding computing values. For example, when the sensing circuit 120 senses that the equivalent resistance $R_{eq}$ of the memory array 110 is between the sensing levels $SL_1$ and $SL_2$, the sensing circuit 120 will generate a computing value corresponding to the sensing level $SL_1$. In some embodiments, the differences between the equivalent resistances $R_{eq}$ respectively corresponding the sensing levels $SL_1$, $SL_2$, . . . , and $SL_n$ are equal. In other embodiments, the differences between the equivalent resistances $R_{eq}$ respectively corresponding the sensing levels $SL_1$, $SL_2$, . . . , and $SL_n$ are not totally equal.

In some embodiments, the number of the sensing levels that the sensing circuit 120 is configured with is positively related to the resolution of the memory device 100. For example, for the memory device 100 with 3-bits read out resolution, the sensing circuit 120 has 7 sensing levels; for the memory device 100 with 4-bits read out resolution, the sensing circuit 120 has 15 sensing levels. In addition, in some embodiments, the resolution of the memory device 100 is also positively related to the number of the memory strings in its memory array 110.

Through the straight lines in FIG. 3, memory devices can generate corresponding computing values when sensing various equivalent resistances $R_{eq}$ in various cases of resistance $R_H$. However, in some instances, the actual equivalent resistance $R_{eq}$ measured from the memory array may only be equal to one-tenth of the equivalent resistance $R_{eq}$ calculated in Formula 1. In other words, the actual equivalent resistance $R_{eq}$ measured from the memory array 110 may be within an interval RG shown in FIG. 3. Since all of the equivalent resistances $R_{eq}$ in the interval RG are lower than the lowest sensing level $SL_1$, the sensing circuit will not be able to sense correctly, result in affecting the output result.

In order to alleviate the above problem, the memory device 100 provided in the present disclosure can make the actual equivalent resistance $R_{eq}$ measured from the memory array 110 include at least one sensing level that the sensing circuit 120 is configured with by adjusting the resistance $R_H$ through the control circuit 130.

Figure 4:
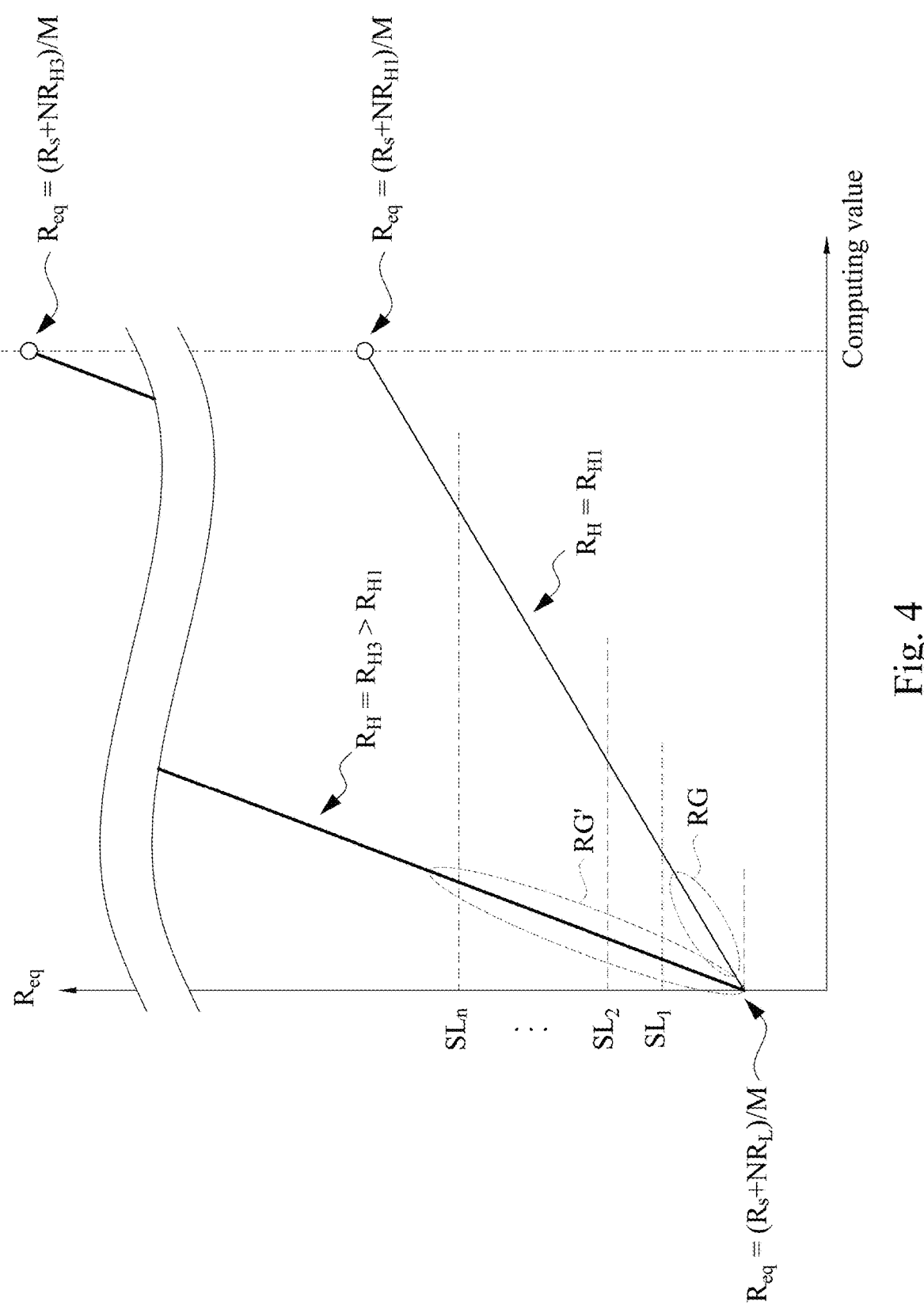
FIG. 4 is a schematic diagram of the relationship between resistance, equivalent resistance and computing value in accordance with some embodiments of the present disclosure.

FIG. 4 is a schematic diagram of the relationship between the resistance $R_H$, the equivalent resistance $R_{eq}$ and computing values in accordance with some embodiments of the present disclosure. The memory device 100 in the present disclosure can make the maximum value of the equivalent resistance $R_{eq}$ calculated through Formula 1 within a specified magnification range (e.g., between one and ten times) of one the sensing levels (e.g., the sensing level $SL_n$), by adjusting the resistance $R_H$ to a resistance $R_{H3}$ greater than the resistance $R_{H1}$ through the control circuit 130.

Take the specified magnification range as "between one and ten times" as an example, according to Formula 3, assuming that N times the resistance $R_H$ is far greater than the resistance of the auxiliary resistor $R_S$, the range of the resistance $R_H$ can be calculated according to the following Formula 4:

$$1 * R_{Sensing} < \frac{1}{M}(R_S + NR_H) \cong \frac{N}{M}R_H < 10 * R_{Sensing} \qquad \text{Formula 4}$$

$$\Rightarrow \frac{M}{N}R_{Sensing} < R_H < 10\frac{M}{N}R_{Sensing}.$$

Wherein $R_{sensing}$ is the equivalent resistance corresponding to a sensing level (e.g., one of the sensing levels $SL_1$, $SL_2$, . . . , and $SL_n$).

Therefore, even if the actual equivalent resistance $R_{eq}$ measured from the memory array 110 may only be equal to one-tenth of the equivalent resistance $R_{eq}$ calculated through Formula 1, the actual equivalent resistance $R_{eq}$ measured from the memory array 110 (i.e., the interval RG') can still include at least one sensing level that the sensing circuit 120 is configured with, thereby alleviating the problem that the sensing circuit 120 cannot sense correctly.

Figure 5:
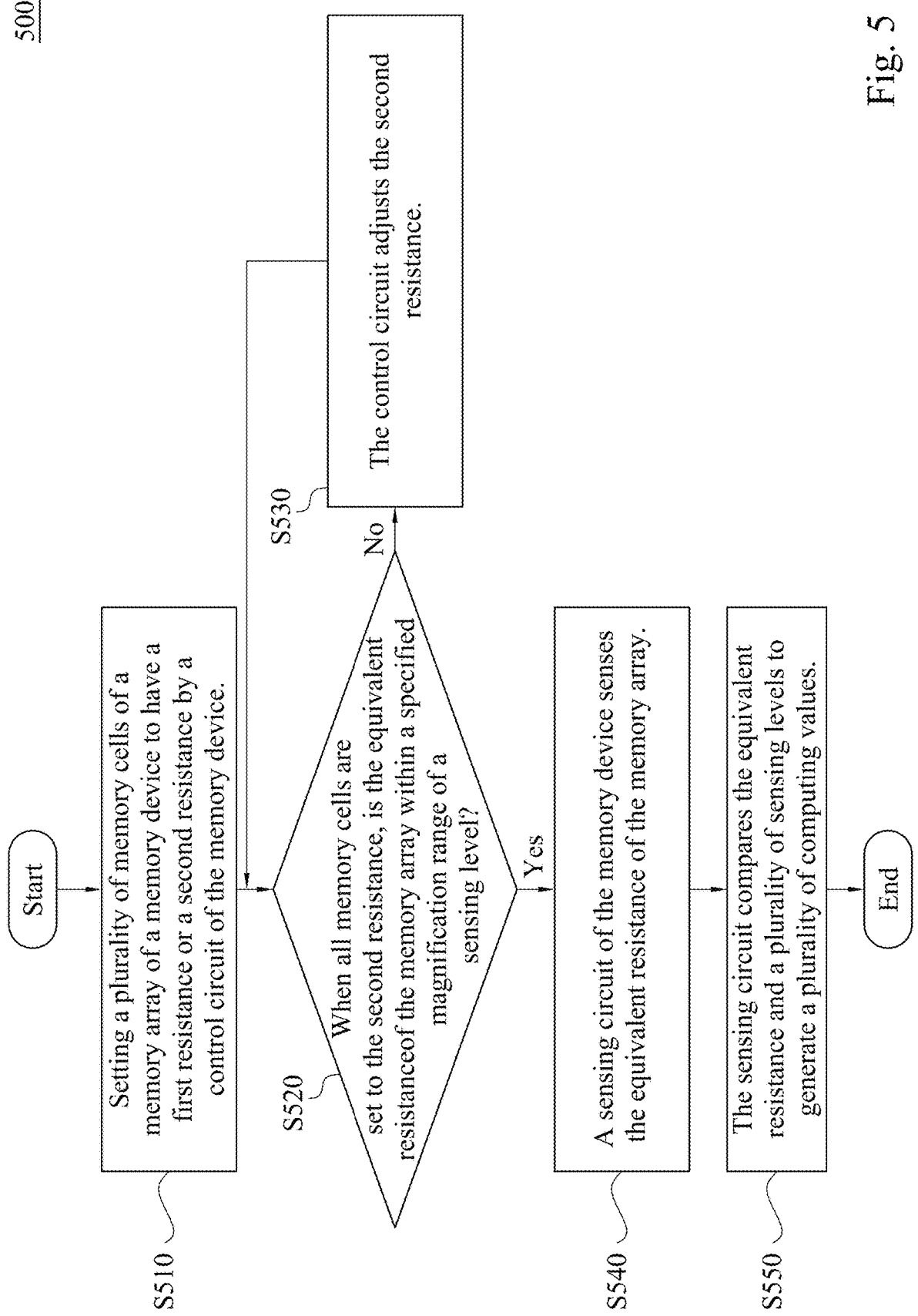
FIG. 5 is a flowchart of an operation method of the memory device in accordance with some embodiments of the present disclosure.

FIG. 5 is a flowchart of an operation method 500 of the memory device in accordance with some embodiments of the present disclosure. In some embodiments, the operation method 500 is suitable for a memory device (e.g., the memory device 100 in FIG. 1) and comprises steps S510, S520, S530, S540 and S550.

In step S510, a control circuit (e.g., the control circuit 130 in FIG. 1) of the memory device sets a plurality of memory cells of a memory array (e.g., the memory array 110) to have a first resistance (e.g., the resistance $R_L$) or a second resistance (e.g., the resistance $R_H$), wherein the second resistance is greater than the first resistance. Next, step S520 will be performed.

In step S520, the control circuit determines that whether the equivalent resistance of the memory array is within a specified magnification range (e.g., between one and ten times) of a sensing level of a sensing circuit (e.g., the sensing circuit in FIG. 1) when all memory cells are set to the second resistance. When the equivalent resistance of the memory array is not within the specified magnification range of the sensing levels, step S530 will be performed; when the equivalent resistance of the memory array is within the specified magnification range of the sensing levels, step S540 will be performed.

In step S530, the control circuit adjusts the second resistance. Next, step S520 will be performed again.

In step S540, the sensing circuit of the memory device senses the equivalent resistance of the memory array. Next, step S550 will be performed. In step S550, the sensing circuit compares the equivalent resistance of the memory array and the sensing levels that it is configured with, and generates corresponding computing values.

It should be noted that the number and order of steps in the operation method 500 in the present disclosure are only examples, and are not intended to limit the present disclosure. Other numbers and order of steps are within the scope of the present disclosure. In some embodiments, the operation method 500 may comprise a step of adjusting the sensing levels of the sensing circuit through the control circuit. In other embodiments, the operation method 500 may comprise a step of storing a plurality of weight values of a neural network through the memory cells based on the first resistance and the second resistance.

In addition, the ranges of the specified magnification ranges described in the present disclosure only examples, and are not intended to limit the present disclosure. Ranges of other magnifications (e.g., between one to five times, between one to twenty times, etc.) of the sensing levels are within the scope of the present disclosure.

Through the memory device 100 and its operation method 500 in the present disclosure, the resistances of the memory cells can be adjusted in specific configuration to ensure that even if the actual equivalent resistance measured from the memory array is lower than the calculated equivalent resistance, this measured equivalent resistance still includes the sensing level of the sensing circuit, so that the memory device 100 can generate accurate calculation results.

The above are preferred embodiments of the present disclosure. It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. A memory device, comprising:
a memory array, comprising a plurality of memory cells, wherein each of the plurality of memory cells has a first resistance or a second resistance greater than the first resistance,
wherein when all of the plurality of memory cells have the first resistance, an equivalent resistance of the memory array is equal to a first equivalent resistance, when all of the plurality of memory cells have the second resistance, the equivalent resistance of the memory array is equal to a second equivalent resistance greater than the first equivalent resistance;
a sensing circuit, coupled to the memory array and configured to sense the equivalent resistance; and
a control circuit, coupled to the memory array and configured to adjust the second resistance, so as to make the second equivalent resistance be within a specified magnification range of one of a plurality of sensing levels of the sensing circuit.

2. The memory device of claim 1, wherein the plurality of memory cells are configured to store a plurality of weight values of a neural network based on the first resistance and the second resistance.

3. The memory device of claim 1, wherein the sensing circuit is further configured to generate a computing value according to the plurality of sensing levels and the equivalent resistance, wherein the computing value is positively related to the plurality of sensing levels and positively related to the equivalent resistance.

4. The memory device of claim 1, wherein the memory array comprises M memory strings, each of the M memory strings comprises N of the plurality of memory cells, wherein M and N are positive integers, and
wherein a resolution of the memory device is positively related to M.

5. The memory device of claim 4, wherein the number of the plurality of sensing levels is positively related to the resolution of the memory device.

6. The memory device of claim 4, wherein each of the M memory strings further comprises an auxiliary resistor, and the N of the plurality of memory cells and the auxiliary resistor are coupled is series.

7. The memory device of claim 6, wherein the first equivalent resistance is equal to the first resistance multiplied by N, plus a resistance of the auxiliary resistor and then divided by M, and the second equivalent resistance is equal to the second resistance multiplied by N, plus the resistance of the auxiliary resistor and then divided by M.

8. The memory device of claim 1, wherein the control circuit is further coupled to the sensing circuit, and the control circuit is further configured to adjust the plurality of sensing levels.

9. An operation method, suitable for a memory device, wherein a memory array of the memory device comprises a plurality of memory cells, the operation method comprises:
setting, by a control circuit of the memory device, the plurality of memory cells to have a first resistance or a second resistance,
wherein when all of the plurality of memory cells have the first resistance, an equivalent resistance of the memory array is equal to a first equivalent resistance, when all of the plurality of memory cells have the second resistance, the equivalent resistance of the memory array is equal to a second equivalent resistance greater than the first equivalent resistance;
adjusting, by the control circuit, the second resistance, so as to make the second equivalent resistance be within a specified magnification range of one of a plurality of sensing levels of a sensing circuit of the memory device; and
sensing, by the sensing circuit, the equivalent resistance.

10. The operation method of claim 9, further comprising:
storing, by the plurality of memory cells, a plurality of weight values of a neural network, based on the first resistance and the second resistance.

11. The operation method of claim 9, further comprising:
generating, by the sensing circuit, a computing value according to the plurality of sensing levels and the equivalent resistance,
wherein the computing value is positively related to the plurality of sensing levels and positively related to the equivalent resistance.

12. The operation method of claim 9, wherein the memory array comprises M memory strings, each of the M memory strings comprises N of the plurality of memory cells, wherein M and N are positive integers, and wherein a resolution of the memory device is positively related to M.

13. The operation method of claim 12, wherein the number of the plurality of sensing levels is positively related to the resolution of the memory device.

14. The operation method of claim 12, wherein each of the M memory strings further comprises an auxiliary resistor, and the N of the plurality of memory cells and the auxiliary resistor are coupled is series.

15. The operation method of claim 14, wherein the first equivalent resistance is equal to the first resistance multiplied by N, plus a resistance of the auxiliary resistor and then divided by M, and the second equivalent resistance is equal to the second resistance multiplied by N, plus the resistance of the auxiliary resistor and then divided by M.

16. The operation method of claim 9, further comprising:

adjusting, by the control circuit, the plurality of sensing levels.

* * * * *